(12) United States Patent
Hosokawa et al.

(10) Patent No.: US 9,831,396 B2
(45) Date of Patent: Nov. 28, 2017

(54) LIGHT EMITTING DEVICE INCLUDING LIGHT EMITTING ELEMENT WITH PHOSPHOR

(71) Applicant: NICHIA CORPORATION, Anan-shi, Tokushima (JP)

(72) Inventors: Shoji Hosokawa, Tokushima (JP); Daiki Kuramoto, Anan (JP); Kenji Nakata, Anan (JP); Atsushi Bando, Itano-gun (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/853,311

(22) Filed: Sep. 14, 2015

(65) Prior Publication Data

US 2016/0079484 A1    Mar. 17, 2016

(30) Foreign Application Priority Data

Sep. 16, 2014  (JP) ................................ 2014-188268

(51) Int. Cl.
*H01L 33/00* (2010.01)
*H01L 23/29* (2006.01)
(Continued)

(52) U.S. Cl.
CPC ............ *H01L 33/502* (2013.01); *H01L 21/56* (2013.01); *H01L 23/29* (2013.01); *H01L 23/295* (2013.01);
(Continued)

(58) Field of Classification Search
CPC ....... H01L 33/502; H01L 33/52; H01L 33/56; H01L 31/0203; H01L 2924/0106;
(Continued)

(56) References Cited

U.S. PATENT DOCUMENTS 6,207,077 B1 *  3/2001  Burnell-Jones .......... C08J 5/043
                                                    252/301.36
2004/0119086 A1    6/2004  Yano et al.
(Continued)

FOREIGN PATENT DOCUMENTS

JP       05315652 A  * 11/1993
JP    2004-193581 A     7/2004
(Continued)

*Primary Examiner* — Teresa M Arroyo
(74) *Attorney, Agent, or Firm* — Andrews Kurth Kenyon LLP

(57) ABSTRACT

A light emitting device includes a light emitting element, a molded member, and a sealing member. The light emitting element is arranged on or above the molded member. The sealing member covers the light emitting element. The sealing member contains a phosphor, and a filler material. The phosphor can be excited by light of the light emitting element, and emit luminescent radiation. The filler material contains neodymium hydroxide, neodymium aluminate or neodymium silicate. The filler material absorbs a part of the spectrum of the mixed light of the light emitting element and the phosphor so that the other parts of the spectrum of this mixed light are extracted from the light emitting device.

13 Claims, 8 Drawing Sheets

(51) Int. Cl.
*H01L 33/50* (2010.01)
*H01L 31/0203* (2014.01)
*H01L 21/56* (2006.01)
*H01L 33/52* (2010.01)
*H01L 33/56* (2010.01)

(52) U.S. Cl.
CPC ........ *H01L 31/0203* (2013.01); *H01L 33/501* (2013.01); *H01L 33/508* (2013.01); *H01L 33/52* (2013.01); *H01L 33/56* (2013.01); *H01L 2924/0106* (2013.01); *H01L 2924/01015* (2013.01); *H01L 2924/181* (2013.01); *H01L 2924/186* (2013.01)

(58) Field of Classification Search
CPC ..... H01L 2924/01015; H01L 2924/181; H01L 2924/186; H01L 23/295; H01L 23/28; H01L 23/29; H01L 21/56; H01L 33/501; H01L 33/508
USPC .................................. 257/98, 100, 789, 795
See application file for complete search history.

(56) References Cited

U.S. PATENT DOCUMENTS

| | | | | |
|---|---|---|---|---|
| 2006/0170332 A1* | 8/2006 | Tamaki | .................. | C09K 11/02 313/498 |
| 2006/0261360 A1* | 11/2006 | Takehashi | ............... | H01L 33/60 257/98 |
| 2007/0268234 A1* | 11/2007 | Wakabayashi | ......... | A61M 21/00 345/102 |
| 2007/0269915 A1* | 11/2007 | Leong | .................... | H01L 33/483 438/28 |
| 2008/0031009 A1* | 2/2008 | Kodaira | .................. | H01L 33/58 362/612 |
| 2008/0297047 A1* | 12/2008 | Kohno | .................... | H01L 33/56 313/512 |
| 2009/0315053 A1* | 12/2009 | Lee | ..................... | C09K 11/7734 257/98 |
| 2012/0019123 A1* | 1/2012 | Furukawa | ............... | H01L 33/54 313/483 |
| 2012/0155061 A1 | 6/2012 | Manabe et al. | | |
| 2013/0062649 A1* | 3/2013 | Hata | .................... | H01L 33/501 257/98 |
| 2015/0179537 A1* | 6/2015 | Shioji | ..................... | H01L 33/46 257/773 |
| 2015/0188006 A1* | 7/2015 | Williams | ................ | H01L 33/56 257/98 |
| 2015/0267052 A1* | 9/2015 | Tchoul | .................... | C08L 83/04 257/98 |

FOREIGN PATENT DOCUMENTS

| | | | |
|---|---|---|---|
| JP | 2004193581 A | * | 7/2004 |
| JP | 2013-505347 A | | 2/2013 |
| KR | 2015094034 A | * | 8/2015 |
| WO | 2011-036447 A1 | | 3/2011 |
| WO | 2011-142127 A1 | | 11/2011 |

* cited by examiner

LIGHT EMITTING DEVICE INCLUDING LIGHT EMITTING ELEMENT WITH PHOSPHOR

CROSS-REFERENCE TO RELATED APPLICATIONS

The present application claims priority under 35 U.S.C. §119 to Japanese Patent Application No. 2014-188,268, filed Sep. 16, 2014. The contents of this application are incorporated herein by reference in their entirety.

BACKGROUND OF THE INVENTION

1. Field of the Invention

The present disclosure relates to a light emitting device that includes a light emitting element with a phosphor.

2. Description of the Related Art

In recent years, light emitting diodes (hereinafter also referred to as LEDs), which provide substantial energy savings, are widely used as light emitting elements instead of filament lamps. Also, light emitting devices are known which include a light emitting element that is formed of gallium nitride (GaN), and a yellow phosphor, for example.

In ordinary lighting fields, a high color rendering is desirable. For example, Japanese Patent Laid-Open Publication No. JP 2004-193,581 A1 discloses a light emitting device that includes a member formed of resin, or the like, mixed with neodymium oxide ($Nd_2O_3$) particles. According to this publication, its color rendering index Ra can be increased since light in a specific wavelength range is absorbed. In addition, International Publication No. WO 2011-142,127 A1 discloses a light emitting device that includes glass containing neodymium ions ($Nd^{3+}$). According to this publication, its color rendering index as well as its luminous efficacy can be improved.

Neodymium oxide and glass containing neodymium absorb light in specific wavelength ranges. Correspondingly, the entire light emission efficiencies of the light emitting devices will be reduced by the absorbed light. From this viewpoint, a light emitting device is desired which has a high color rendering while suppressing the reduction of its light emission efficiency.

The present invention is devised for further improvements. It is one object of the present invention to provide a light emitting device that has both a high color rendering and an improved light emission efficiency.

SUMMARY OF THE INVENTION

A light emitting device according to one aspect of the present invention includes a light emitting element, a molded member, and a sealing member. The light emitting element is arranged on or above the molded member. The sealing member covers the light emitting element. The sealing member contains a phosphor, and a filler material. The phosphor can be excited by light of the light emitting element, and emit luminescent radiation. The filler material contains neodymium hydroxide, neodymium aluminate or neodymium silicate.

According to the above aspect, not only the color rendering but also the light emission efficiency of the light emitting device can be high.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENTS

Figure 1:
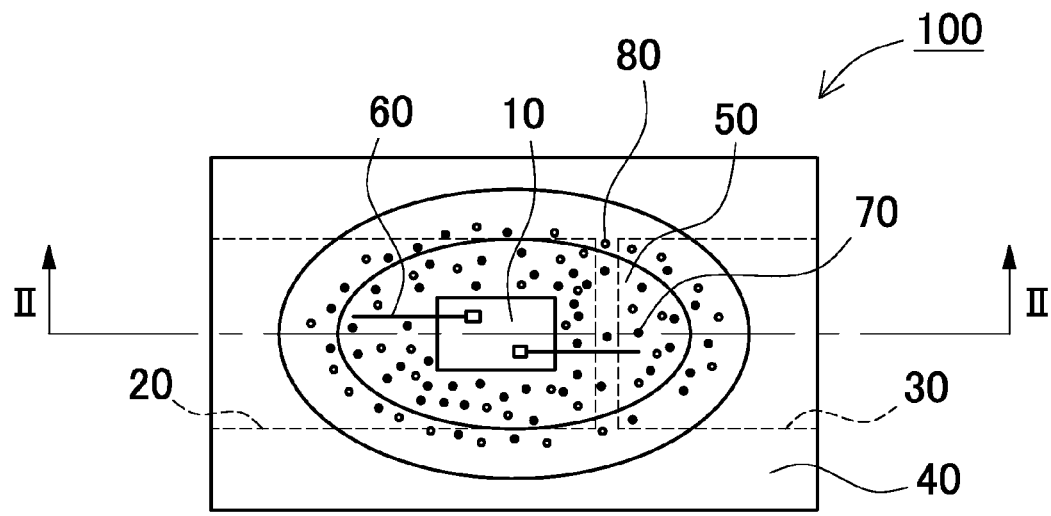
FIG. 1 is a schematic plan view showing a light emitting device according to an embodiment of the present invention.

The embodiments will now be described with reference to the accompanying drawings, wherein like reference numerals designate corresponding or identical elements throughout the various drawings.

It should be appreciated, however, that the embodiments described below are illustrations of a light emitting device to give a concrete form to technical ideas of the invention, and a light emitting device of the invention is not specifically limited to description below. Furthermore, it should be appreciated that the members shown in claims attached hereto are not specifically limited to members in the embodiments. Unless otherwise specified, any dimensions, materials, shapes and relative arrangements of the parts described in the embodiments are given as an example and not as a limitation. Additionally, the sizes and the positional relationships of the members in each of drawings are occasionally shown exaggeratingly for ease of explanation.

In description of the present invention, relationship between color name and chromaticity coordinates, relationship between light wavelength range and monochromatic light, and the like are based on the JIS standard (JIS Z8110). Specifically, a range of 380 to 455 nm corresponds to the bluish violet color, a range of 455 to 485 nm corresponds to blue, a range of 485 to 495 nm corresponds to bluish green, a range of 495 to 548 nm corresponds to green, a range of 548 to 573 nm corresponds to yellowish green, a range of 573 to 584 nm corresponds to yellow, a range of 584 to 610 nm corresponds to apricot, and a range of 610 to 780 nm corresponds to red.

A light emitting device according to an embodiment includes a light emitting element, a molded member that holds the light emitting element, and a sealing member that covers the light emitting element. The sealing member contains a phosphor, and a filler material. The phosphor can be excited by light of the light emitting element, and emit luminescent radiation. The filler material absorbs a part of the spectrum of the mixed light of the light emitting element and the phosphor, and reflects the other parts of the spectrum of this mixed light. Since a part of the spectrum of the mixed light of the light emitting element and the phosphor is absorbed, the profile of the spectrum of the mixed light correspondingly drops. Thus, the color rendering of the light emitting device can be improved. On the other hand, the reflected light by the filler material is extracted as light emitted by the light emitting device. In order to improve the light emission efficiency of the light emitting device according to the present invention as compared with the light emitting devices discussed in the background, it is necessary to increase the reflected light. To achieve this, the filler material of the embodiment contains neodymium hydroxide, neodymium aluminate, or neodymium silicate. These materials have higher reflectance in a specific wavelength range than neodymium oxide and neodymium glass discussed in the background. Accordingly, the light emitting device of the embodiment can have a high color rendering while providing a light emission efficiency higher than the light emitting devices discussed in the background.

Various shapes of light emitting devices including a light emitting element are known such as bullet type and surface mount type light emitting devices. The bullet type light emitting device in this specification refers to a light emitting device that includes a bullet-shaped sealing member for covering a light emitting element, and leads. The light emitting element is mounted on one of the leads. The leads serve as terminals to be connected to the outside. The surface mount type light emitting device refers to a light emitting device that includes a light emitting element, a molded member that includes leads and holds the light emitting element, and a sealing member that is arranged on the molded member and covers the light emitting element. In addition, another type of light emitting device is known which includes a light emitting element, a plate-shaped circuit board on which the light emitting element is mounted, and a sealing member that contains a phosphor and is formed in a lens shape, or the like.

Figure 2:
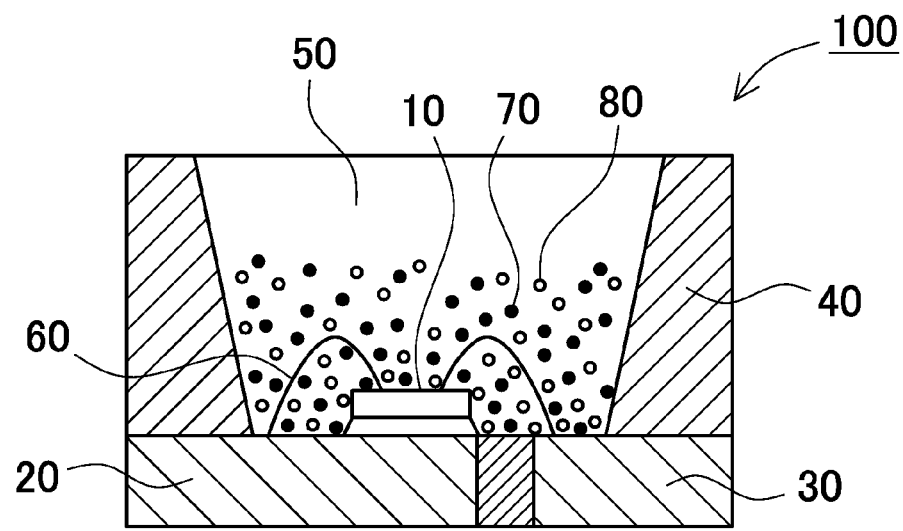
FIG. 2 is a schematic cross-sectional view of the light emitting device shown in FIG. 1 taken along the line II-II.

FIG. 1 is a schematic plan view showing a light emitting device according to the embodiment of the present invention. FIG. 2 is a schematic cross-sectional view of the light emitting device shown in FIG. 1 taken along the line II-II indicated in FIG. 1. The light emitting device according to the embodiment is an exemplary surface mount type light emitting device.

The light emitting device 100 includes a light emitting element 10 which is formed of gallium-nitride-based semiconductors and emits light in the short wavelength range of visible light, and a molded member 40 which has a recessed part for accommodating the light emitting element 10. The molded member 40 includes first and second leads 20 and 30. Parts of the first and second leads 20 and 30 are exposed from the bottom surface of the recessed part. The molded member 40 is integrally formed with the leads 20 and 30, and is formed of a thermoplastic resin or thermosetting resin. The recessed part of the molded member 40 is surrounded by the bottom and side surfaces. The light emitting element 10 is arranged on the bottom surface of the recessed part. The light emitting element 10 includes a pair of electrodes (positive and negative electrodes). The pair of electrodes (positive and negative electrodes) are electrically connected to the first and second leads 20 and 30 through wires 60. The light emitting element 10 is enclosed by the sealing member 50. The sealing member 50 contains a phosphor 70, and a filler material 80. The phosphor 70 converts light having a peak wavelength of the light emitting element 10 into light having a peak wavelength different from the light of the light emitting element 10. The filler material 80 absorbs a part of the spectrum of the mixed light of the light emitting element 10 and the phosphor 70, and reflects the other parts of the spectrum of this mixed light. The following description will describe the components of the light emitting device.

(Filler Material)

As shown in FIG. 2, the sealing member 50 contains the phosphor 70 and the filler material 80. In the embodiment shown in FIG. 2, the phosphor and the filler material 80 are contained in the common sealing member 50. Specifically, the phosphor and the filler material are mixed so as to be substantially uniformly distributed in the sealing member. In this embodiment, in the production process of the light emitting device, only a step for mixing the materials of the phosphor, the filler material, and the sealing member is required for preparation of the sealing member. For this reason, the workability can be high in the production process of the light emitting device according to this embodiment as compared with other modified embodiments which will be described later.

In order to efficiently absorb a part of light in the range from yellow to apricot in the mixed light of the light emitting element 10 and the phosphor 70, which is excited by the light of the light emitting element 10, the filler material is arranged in proximity to the light emitting element 10 and the phosphor 70 in the sealing member 50. It is preferable that the reflectance of the filler material is not smaller than 50% and not greater than 65% in the wavelength range of not shorter than 575 nm and not longer than 605 nm. The reason is that if the reflectance exceeds the upper limit in the aforementioned wavelength range, the part of light cannot be sufficiently absorbed. As a result, the color rendering of the light emitting device may not be high enough. On the other hand, if the reflectance falls below the lower limit, the absorbed amount of light by the filler material is too much. This may cause reduction of the light emission efficiency of the light emitting device.

The material of the filler material 80 includes at least neodymium hydroxide, neodymium aluminate, or neodymium silicate. The sealing member 50 mixed with particles of this material can be used. It is preferable that the added amount of neodymium hydroxide, neodymium aluminate, or neodymium silicate is not smaller than 0.01% by weight and not greater than 10% by weight of the material of the sealing member 50. The reason is that if the added amount of neodymium hydroxide, neodymium aluminate, or neodymium silicate is too small, the aforementioned part of light cannot be sufficiently absorbed by the filler material. As a result, the color rendering of the light emitting device may not be high enough. On the other hand, if the added amount is too large, the absorbed amount of light by the filler material is too much. This may cause reduction of the light emission efficiency of the light emitting device. Examples of neodymium hydroxide can be provided by $Nd(OH)_3$, and $NdO_2H$ which can be obtained by thermal decomposition of $Nd(OH)_3$ (e.g., 390° C. in Pt crucible). In particular, $Nd(OH)_3$ is preferably used. The reason is that $Nd(OH)_3$ has a good reflectance in the aforementioned wavelength range so that the color rendering of the light emitting device can be sufficiently increased while the light emission efficiency of the light emitting device can be improved as compared with other materials. The general formula of neodymium silicate or neodymium aluminate is represented by $Nd_x M_y O_z$. Here, M is Si or Al, and x, y and z satisfy $1 \leq x \leq 10$, $1 \leq y \leq 15$, and $3 \leq z \leq 45$, more preferably $1 \leq x \leq 10$, $1 \leq y \leq 10$ and $3 \leq z \leq 30$, respectively. This is because neodymium silicate or neodymium aluminate having this composition for providing a suitable reflectance capable of achieving the effect according to the present invention can be relatively easily synthesized, and commercially available.

Exemplary compositions of such neodymium aluminate or neodymium silicate can be provided by $NdSiO_5$, $Nd_2SiO_5$, $Nd_2Si_2O_7$, $Nd_2Si_3O_9$, $Nd_2Si_3O_{12}$, $Nd_4Si_3O_{12}$, $Nd_{9.33}(SiO_4)_6O_2$, $NdAlO_3$, $NdAl_{11}O_8$, $NdAl_{11}O_{18}$, $Nd_{1.65}Al_{23.43}O_{38}$, and $Nd_4Al_2O_9$, for example. In particular, $NdAlO_3$, $Nd_2Si_2O_7$, and $Nd_{9.83}((Si, Al)O_4)_6O_2$ are preferably used which have smaller mole ratios of Nd with respect to Al or Si. The reason is that as the mole ratio of Nd with respect to Al or Si becomes smaller, the filler material is likely to have a better reflectance capable of achieving the effect according to the present invention.

The mean particle diameter of the filler material is not smaller than 0.1 μm and not greater than 5 μm. It is preferable that this mean particle diameter is not smaller than 1 μm and not greater than 5 μm. Furthermore, it is more preferable that the mean particle diameter of the filler material is not smaller than 1 μm and not greater than 2 μm. The reason is that if the mean particle diameter of the filler material is too small, the aforementioned part of light cannot be sufficiently absorbed. As a result, the color rendering of the light emitting device may not be high enough. On the other hand, if the mean particle diameter of the filler material is too large, the added amount of the filler material is necessarily increased to achieve a certain diffusion effect. In the case where the added amount of the filler material is increased, the absorbed amount of light by the filler material may be too much. As a result, this may cause reduction of the light emission efficiency of the light emitting device. From this viewpoint, it is preferable to avoid increasing the mean particle diameter of the filler material too much.

In this specification, the term "mean particle diameter" refers to a mean particle diameter measured by an aperture's electrical resistance method (electrical sensing zone method) based on the Coulter principle. The aperture's electrical resistance method is a particle measurement method using electric resistances of particles. Specifically, the method obtains the diameters of particles of the phosphor or the filler material in accordance with their electric resistances produced when they pass an aperture of an aperture tube after they are distributed in an electrolytic solution.

Figure 3:
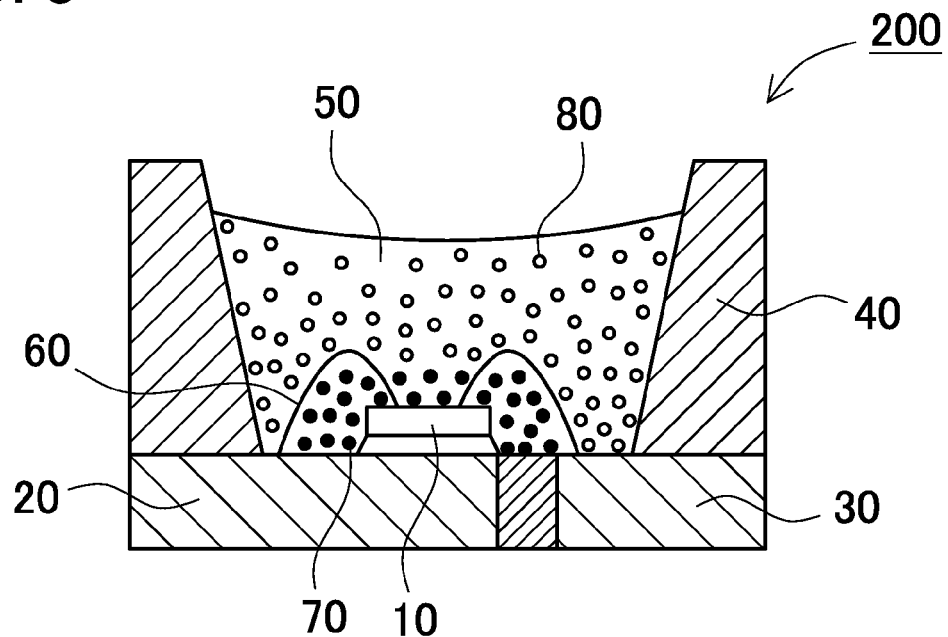
FIG. 3 is a schematic cross-sectional view showing a light emitting device according to a first modified embodiment of the present invention.

In the embodiment shown in FIG. 2, the phosphor 70 as well as the filler material 80 is mixed in the sealing member 50. That is, the phosphor 70 and the filler material 80 can be contained in the common member. The filler material 80 can be preferably distributed in a part of the sealing member 50 outside the part where the phosphor 70 is mainly distributed as shown in FIG. 3 rather than being uniformly distributed together with the phosphor 70 in the sealing member 50. This arrangement can be obtained by firstly settling the phosphor 70 and then settling the filler material 80 in the sealing member 50, for example. Alternatively, the arrangement of the phosphor and the filler material can be controlled by difference between the settling velocities of the phosphor and the filler material caused by the difference between their specific gravities so that the filler material can be located on or above the phosphor.

(Light Emitting Element 10)

The light emitting element 10 can emit light from the ultraviolet range to the visible light range. The peak wavelength of light emitted by the light emitting element 10 preferably falls within the wavelength range from 240 to 520 nm, more preferably from 420 to 470 nm. For example, a nitride semiconductor device ($In_xAl_yGa_{1-x-y}N$, $0 \leq x$, $0 \leq y$, $x+y \leq 1$) can be used as the light emitting element 10.

The light emitting element 10 includes semiconductor layers of nitride semiconductors. The semiconductor layers include n-type, active, and p-type layers that are deposited in this order on or above a sapphire substrate. An n-pad electrode is formed on an exposed part of the n-type semiconductor that extends in a line which extends in a wafer before the wafer is divided into chips. On the other hand, a p-pad electrode is formed on a p-ohmic electrode. The light emitting element 10 preferably includes the active layer which has a light emission peak wavelength in the range from about 240 to 520 nm and can emit light with a light emission wavelength capable of efficiently exciting the phosphor substance. Although the nitride semiconductor light emitting element has been illustratively described as the light emitting element 10, the light emitting element according to the present invention is not limited to this.

The light emitting element 10 emits light having a light emission peak wavelength in the aforementioned wavelength range. At least one phosphor 70 is excited by the light of the light emitting element 10. As a result, the light emitting device emits predetermined color light. In addition, this light emitting element 10 can have a narrow width of its light emission spectrum. For this reason, the light emitting element 10 can efficiently excite the phosphor.

(Phosphor 70)

The phosphor 70 according to this embodiment is distributed in the sealing member 50. The sealing member 50 serves not only as a member for protecting the light emitting element 10 and the phosphor 70 from the external environments but also as a wavelength conversion member for absorbing a part of the light of the light emitting element 10 for wavelength conversion. In the case where the sealing member including the phosphor is arranged in proximity to the light emitting element 10, the light of the light emitting element 10 can be efficiently converted into light with a different wavelength from the light of the light emitting element 10. As a result, the light emitting device can have a high light emission efficiency. However, the sealing member 50 including the phosphor 70 is not limited to be arranged in proximity to the light emitting element 10. In consideration of influence of heat on the phosphor 70, the wavelength conversion member containing the phosphor 70 can be spaced at a certain interval from the light emitting element 10. On the other hand, in the case where the phosphor is substantially uniformly distributed in the sealing member, color unevenness of light can be reduced.

Also, two or more types of phosphors 70 can be used. For example, the light emitting device according to this embodiment can include the light emitting element 10 which emits blue light, the phosphor which can be excited by the blue light and emit yellow light together with the phosphor which can be excited by the blue light and emit red light. In this case, the light emitting device can emit white light with a good color rendering.

Also, blue, green, yellow, orange, and red phosphors may be suitably selected for target spectrum adjustment. Combination of these phosphors for adjustment can allow fine adjustment of the color rendering of the light emitting device.

Examples of phosphors which can emit blue to bluish green light can be provided by $(Ca, Sr, Ba)_5(PO_4)_3(F, Cl, Br):Eu$, $BaMgAl_{10}O_{17}:Eu$, $(Ba, Sr, Ca)_3MgSi_2O_8:Eu$, $Sr_4Al_{14}O_{25}:Eu$, $BaSi_2N_{10}:Eu$, $(Ba, Sr, Ca)Al_2Si_3O_4N_4:Eu$, and $BaSi_2O_2N_2:Eu$, for example.

Examples of phosphors which can emit green to yellow light can be provided by silicate phosphors such as $(Ca, Sr, Ba)_2SiO_4:Eu$ and $Ca_3Sc_2Si_3O_{12}:Ce$, chlorosilicate phosphors such as $Ca_8MgSi_4O_{16}Cl_{2-\delta}:Eu$ ($0 \leq \delta \leq 0.5$), oxynitride phosphors such as $(Ca, Sr, Ba)_3Si_6O_9N_4:Eu$, $(Ca, Sr, Ba)_3Si_6O_{12}N_2:Eu$, $(Ca, Sr, Ba)Si_2O_2N_2:Eu$ and $Sr_3Si_{13}Al_3O_2N_{21}:Eu$, oxynitride phosphors such as β-SIALON of $Si_{6-z}Al_zO_zN_{8-z}:Eu$ ($0 < z < 4.2$), aluminate phosphors activated by Ce such as $(Y, Lu)_3(Al, Ga)_5O_{12}:Ce$, sulfide phosphors activated by Eu such as $SrGa_2S_4:Eu$, oxide phosphors such as $CaSc_2O_4:Ce$ and $SrAl_2O_4:Eu$, and nitride phosphors such as $La_3Si_6N_{11}:Ce$, for example.

Examples of phosphors which can emit yellow to orange light can be provided by $(Sr, Ba, Ca, Mg)_2SiO_4:Eu$, $(Sr, Ca, Ba)_3SiO_5:Eu$, $(Ca, Sr)Si_2O_2N_2:Eu$, $(Ca, Sr)_{m/2}Si_{12-m-n}Al_{m+n}N_{16-n}:Eu$, $(Sr, Ca)AlSiN_3:Ce$, and $(Y, Gd)_3(Al, Ga)_5O_{12}:Ce$, for example.

Examples of phosphors which can emit orange to red light can be provided by nitride phosphors such as $(Ca_{1-x}Sr_x)AlSiN_3:Eu$ ($0 \leq x \leq 1.0$), $(Ca_{1-x-y}Sr_xBa_y)_2Si_5N_8:Eu$ ($0 \leq x \leq 1.0$, $0 \leq y \leq 1.0$), $SrAlSi_4N_7:Eu$ and $(Ca, Sr)LiAl_3N_4:Eu$, halide phosphors such as $K_2(Si_{1-x-y}Ge_xTi_y)F_6:Mn$ ($0 \leq x \leq 1.0$, $0 \leq y \leq 1.0$), and sulfide phosphors such as $(Ca, Sr)S:Eu$, for example. In the case where these phosphors for emitting red light are used, components corresponding to three primary colors can have wide half-value widths.

(Sealing Member 50)

The sealing member 50 is formed of light-transmissive resin or glass. The recessed part of the light emitting device 100 is filled with the light-transmissive resin or glass so that the light emitting element 10 is covered by the sealing member 50. In terms of ease of production, the sealing member 50 is preferably formed of light-transmissive resin. In terms of lightfastness, silicone resin compositions and the like are preferably used as the light-transmissive resin. However, electrically insulating resin compositions such as epoxy resin composition, acrylic resin composition or the like can be also used. Another member can be suitably included together with the phosphor 70 and the filler material 80 in the sealing member 50. For example, in addition to the filler material 80, other light diffusion members can be added to the sealing member 70. In this case, the directivity from the light emitting element 10 can be reduced so that the viewing angle can be increased. Examples of other light diffusion members can be provided by particles of silica and alumina.

Examples 1-4, and Comparative Example

Light emitting devices are produced which include neodymium hydroxide (example 1), and compositions of neodymium aluminate or neodymium silicate (examples 2 to 4). The following description describes the measured light emission properties of the light emitting devices according to the examples 1 to 4 in comparison with a light emitting device of a comparative example. The produced light emitting devices according to the examples and the comparative example are surface mount type light emitting devices shown in FIG. 2. Each light emitting device includes an LED chip as the light emitting element 10 having a size of 500 μm×290 μm and a light emission peak wavelength of 450 nm. Both $Y_3(Al, Ga)_5O_{12}:Ce$ and $(Sr, Ca)AlSiN_3:Eu$ are used as the phosphor 70 in each light emitting device. The material of the sealing member is a silicone resin. The phosphor, the filler material, and the silicone resin are mixed at the ratios shown in Table 2 so that the phosphor and the filler material are substantially uniformly distributed in the silicone resin. The silicone resin mixed with the phosphor and the filler material is dropped into the recessed part of the molded member so as to cover the light emitting element from the top side of the light emitting element. After that, the resin is cured.

The light emitting devices according to the examples 1 to 4 and the comparative example are produced which have the same structure except that neodymium hydroxide, the compositions of neodymium aluminate or neodymium silicate, or neodymium oxide is used as the filler material.

Table 1 shows the composition of neodymium hydroxide, the compositions of neodymium aluminate or neodymium silicate, and the composition of neodymium oxide, and their particle diameters and reflectance in the examples and the comparative example. The reflectance of the composition of neodymium hydroxide, the compositions of neodymium aluminate or neodymium silicate, and the composition of neodymium oxide in the examples and the comparative example are reflectance at the wavelengths shown in the rightmost column of Table 1. Table 2 shows relative luminous fluxes, general color rendering indices Ra, special color rendering indices R9, chromaticities x and y, and ratios of the filler materials with respect to the resin used as the sealing member. The relative luminous fluxes of the light emitting devices according to the examples are values where the luminous flux of the light emitting device of the comparative example, which includes neodymium oxide ($Nd_2O_3$) as the filler material, is defined as the reference luminous flux (100%). The special color rendering indices R9 indicate redness.

In addition, FIGS. 8 to 11 show the measured reflection spectra of filler materials used in the light emitting devices according to the examples and the comparative example. FIGS. 12 to 15 show the light emission spectra of the light emitting devices according to the examples and the comparative example. FIGS. 8, 9, 10 and 11 area graphs showing the reflection spectra of the filler materials used in the examples 1, 2, 3 and 4, respectively, together with the reflection spectrum of the filler material used in the comparative example. Also, FIGS. 12, 13, 14 and 15 area graphs showing the light emission spectra of the light emitting devices according to the examples 1, 2, 3 and 4, respectively, together with the light emission spectrum of the light emitting device of the comparative example.

TABLE 1

| No. | Compositions | Dm (μm) | Reflectance (%) | Wavelength (nm) |
|---|---|---|---|---|
| Ex. 1 | Nd(OH)$_3$ | 1.8 | 51.8 | 580 |
| Ex. 2 | NdAlO$_3$ | 2.0 | 60.9 | 585 |

TABLE 1-continued

| No. | Compositions | Dm (μm) | Reflectance (%) | Wavelength (nm) |
|---|---|---|---|---|
| Ex. 3 | $Nd_2Si_2O_7$, | 2.0 | 60.4 | 583 |
| Ex. 4 | $Nd_{9.83}((Si,Al)O_4)_6O_2$ | 2.0 | 52.4 | 585 |
| Comp. | $Nd_2O_3$ | 4.9 | 28.4 | 599 |

As shown in Table 1, the particle diameters of neodymium hydroxide, and the neodymium aluminate or neodymium silicate compositions in the examples are about 1.8 to 2.0 μm. As shown in the reflection spectra of the filler materials shown in FIGS. 8 to 11, the reflection spectrum of each of all of the filler materials used in the light emitting devices according to the examples has a low-reflection range (high-absorption range) in the wavelength range of not shorter than about 575 nm and not longer than about 605 nm. The reflectance of each filler material in the low-reflection range is smaller than its reflectance in the wavelengths longer than the upper limit and shorter than the lower limit of the low-reflection range. The absorption in the low-reflection range increases the color rendering of the light emitting device which includes the filler material used in the example. The reflectances of the filler materials used in the examples are not smaller than 50% and not greater than 65% in the aforementioned wavelength range, and higher than the comparative example. As a result, the light emitting devices according to the examples can have higher light emission efficiency than the comparative example.

TABLE 2

| No. | Compositions | Resin Ratios (%) | x | y | Ra | R9 | luminous flux |
|---|---|---|---|---|---|---|---|
| Ex. 1 | $Nd(OH)_3$ | 4 | 0.466 | 0.415 | 94.0 | 85.5 | 131.0 |
| Ex. 2 | $NdAlO_3$ | 7 | 0.475 | 0.429 | 93.2 | 89.7 | 109.2 |
| Ex. 3 | $Nd_2Si_2O_7$, | 10 | 0.473 | 0.427 | 91.2 | 94.5 | 101.0 |
| Ex. 4 | $Nd_{9.83}((Si, Al)O_4)_6O_2$ | 7 | 0.470 | 0.427 | 88.6 | 77.5 | 103.8 |
| Comp. | $Nd_2O_3$ | 4 | 0.470 | 0.423 | 88.3 | 58.9 | 100.0 |

As shown in Table 2, the chromaticities lie around the point (x, y)=(0.47, 0.42), and the color temperatures are about 2700 K. As shown in FIGS. 8 to 11, the profiles of the spectra of the filler materials used in the examples and the comparative example substantially drop in about 580 to 600 nm. The added amounts of neodymium hydroxide, and the neodymium aluminate or neodymium silicate compositions are adjusted so that the intensity ratios of the drop part around 580 to 600 nm become about 30% with respect to the highest intensity around 630 nm. The added amounts are 4% to 10%. Ra is around 90, and R9 is 60 to 90.

Also, as shown in Table 2, it is found that the light emitting device according to the example 1, which includes neodymium hydroxide, has a very high relative luminous flux of 131% where the luminous flux of the light emitting device according to the comparative example, which includes neodymium oxide, is defined as 100%. As discussed above, it is concluded that the luminous flux and the color rendering of the light emitting device can be improved when neodymium hydroxide, neodymium aluminate, or neodymium silicate is used as the filler material as compared with case where the neodymium oxide is used.

First Modified Embodiment

Although the light emitting device according to the foregoing embodiment has been described, light emitting devices according to modified embodiments can be constructed by adding processes for distributing the phosphor and the filler material in different parts of the sealing member, or separately positioning the phosphor and the filler material. Since the production method of the light emitting device according to the foregoing embodiment can omit the processes for distributing the phosphor and the filler material in different parts of the sealing member, or separately positioning the phosphor and the filler material, the light emitting device according to the foregoing embodiment can be easily produced, and the production workability can be improved. From this viewpoint, it can be said that the foregoing embodiment is better than the following modified embodiments.

The sealing member 50 according to a first modified embodiment includes first and second portions. The first portion covers the light emitting element 10, and contains the phosphor. The second portion covers the first portion, and contains the filler material 80. FIG. 3 is a cross-sectional view showing a light emitting device 200 according to the first modified embodiment. The sealing member of the light emitting device 200 shown in FIG. 3 includes the first portion which covers the light emitting element 10 and contains the phosphor 70, and the second portion which contains the filler material 80 on or above the first portion. To form this sealing member 50, the resin material of the sealing member containing the phosphor can be dropped onto the light emitting element, and subsequently the resin material containing the filler material can be dropped. After that, the resin materials can be cured. According to this process, the sealing member which includes the aforementioned first and second portions can be relatively easily formed so that the phosphor and the filler material can be arranged on or above the light emitting element 10.

Second Modified Embodiment

Figure 4:
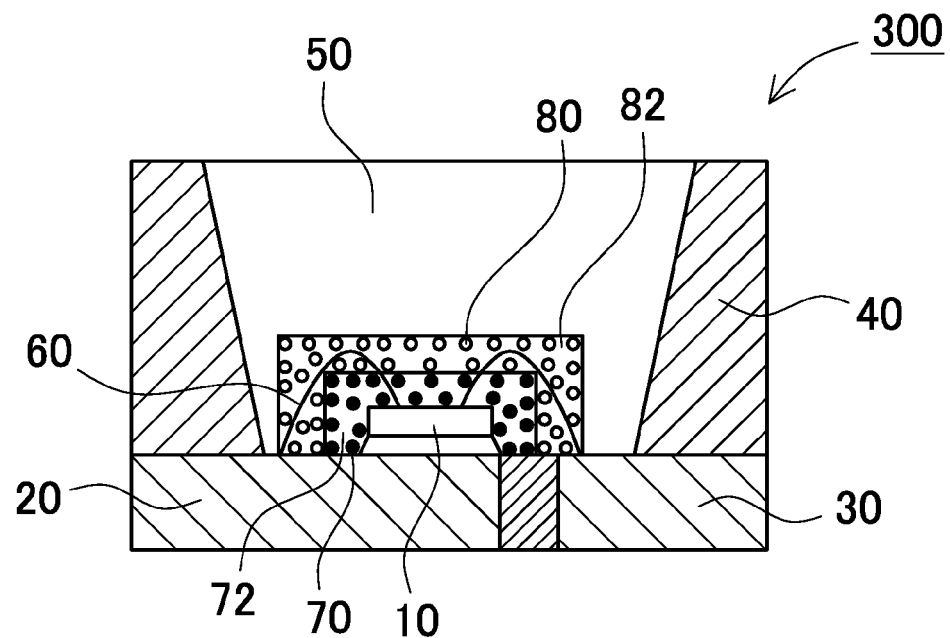
FIG. 4 is a schematic cross-sectional view showing a light emitting device according to a second modified embodiment of the present invention.

A light emitting device 300 according to the second modified embodiment shown in FIG. 4, the sealing member is constructed of a plurality of parts similar to the first modified embodiment. For example, the parts can be a first portion 72 which the phosphor 70, and a second portion 82 which contains the filler material 80 on or above the first portion 72. The first and second portions 72 and 82 are separately provided, and formed in layers so that each of the layers has a substantially uniform thickness in all directions. This sealing member containing the first and second portions 72 and 82 can be formed by filling molds, which have shapes corresponding to the first and second portions 72 and 82, with the resin materials, which contains the phosphor 70 and the filler material 80, and curing the resin materials corresponding to the first and second portions 72 and 82, for example.

It is noted that the boundary between the first portion 72, which contains the phosphor 70, and the second portion 82, which contains the filler material 80, is clearly shown in FIG. 4 for ease of representation in the drawing. However, the present invention is not limited to this. The first portion containing the phosphor 70 and the second portion containing the filler material 80 do not necessarily have a clear boundary between them. That is, no clear boundary may be formed between the first and second portions. For example, the concentrations of the filler material and the phosphor may vary in the layer thickness direction.

Third Modified Embodiment

Figure 5:
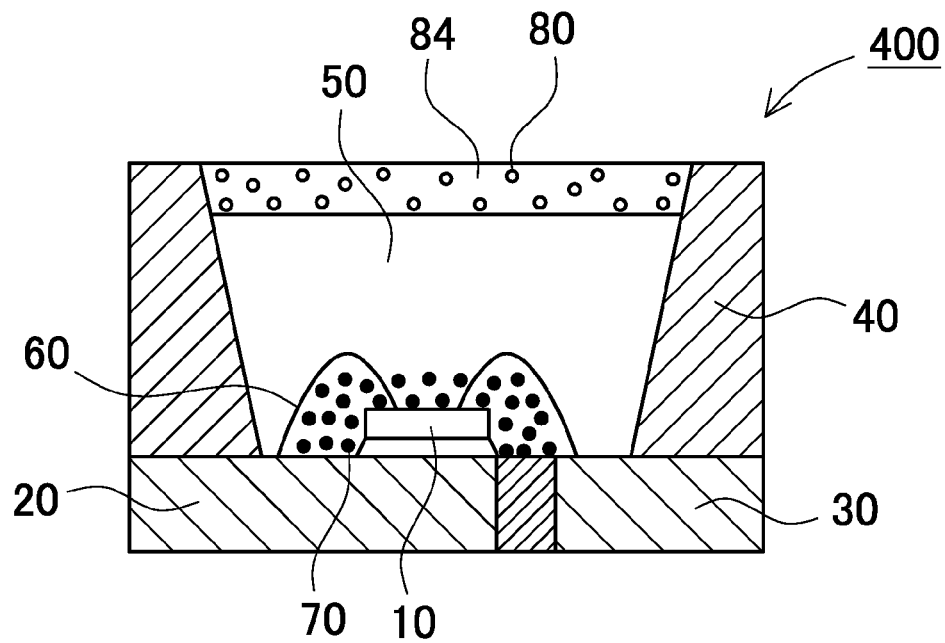
FIG. 5 is a schematic cross-sectional view showing a light emitting device according to a third modified embodiment of the present invention.

Although the filler material has been described to be arranged in proximity to the phosphor and the light emitting element in the foregoing embodiment, the present invention is not limited to this. That is, the aforementioned first and second portions can be spaced at an interval away from each other. For example, as shown in FIG. 5 (third modified embodiment) or 6 (later-discussed fourth modified embodiment), the phosphor 70 can be arranged around the periphery of the light emitting element 10, while a sealing member 50 that includes neither the phosphor 70 nor the filler material 80 can be arranged between the phosphor 70 and the filler material 80 so that a second portion 84 or 86 which contains the filler material 80 can be arranged on or above the sealing member 50.

In the first to third modified embodiments where the filler material is physically spaced away from the phosphor as discussed above, the filler material can more effectively absorb a part of color-mixed light of the phosphor and the light emitting element 10 and more effectively reflect the other parts of the color-mixed light. In other words, in the case where the filler material is not spaced away from the phosphor, a part of light of the light emitting element or a part of light of the phosphor may be extracted from the light emitting device without subjected to the control of the filler material. Contrary to this, in the case where the filler material is spaced away from the phosphor so that the filler material is arranged on the exterior side of the phosphor with respect to the light emitting element, the light of the light emitting element and the light of the phosphor can be more effectively subjected to the control of the filler material.

In addition, in the case where the filler material 80 is spaced away from the light emitting element 10, there is an effect that the filler material 80 can be protected from heat that is dissipated from the light emitting element 10. Also, as for the phosphor 70, in addition to the filler material 80, both the filler material 80 and the phosphor 70 may be spaced away from the light emitting element 10. For example, the phosphor 70 may be arranged in a layer of resin under the second portion 84 containing the filler material 80.

Fourth Modified Embodiment

The first or second portion can be arranged on the upper surface of the molded member. For example, in the fourth embodiment shown in FIG. 6, the second portion 86 containing the filler material 80 is arranged on the upper surface of the molded member 40, which has the recessed part.

Figure 6:
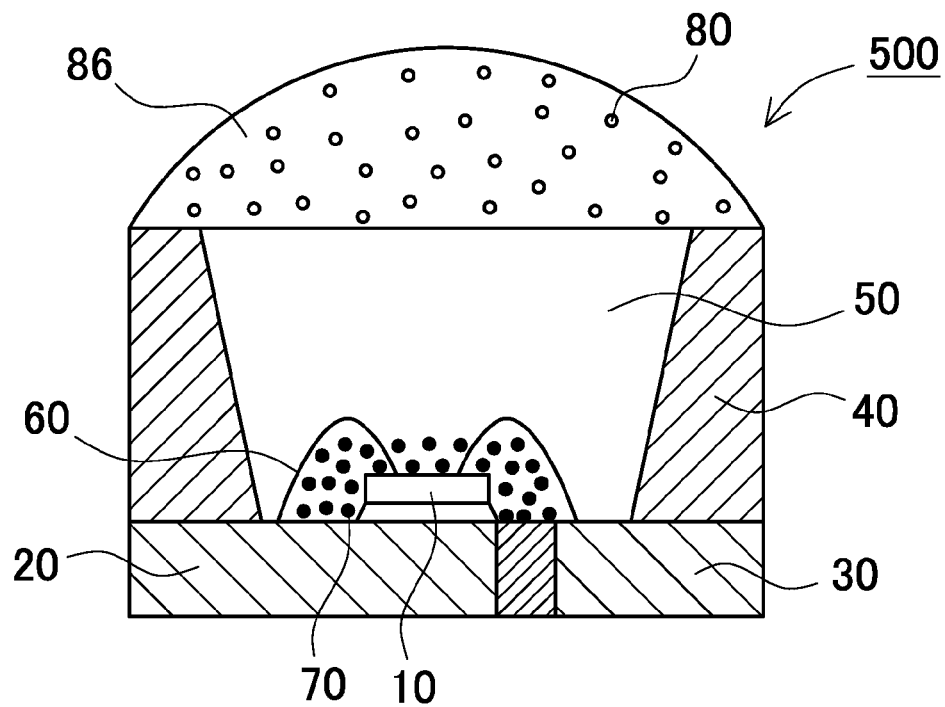
FIG. 6 is a schematic cross-sectional view showing a light emitting device according to a fourth modified embodiment of the present invention.

The shape of the sealing member mixed with the filler material is not specifically limited. For example, as shown in FIG. 6, the second portion 86 of a light emitting device 500 according to the fourth modified embodiment has a lens shape of the sealing member, and contains the filler material 80 which is distributed in the second portion 86.

Fifth Modified Embodiment

Figure 7:
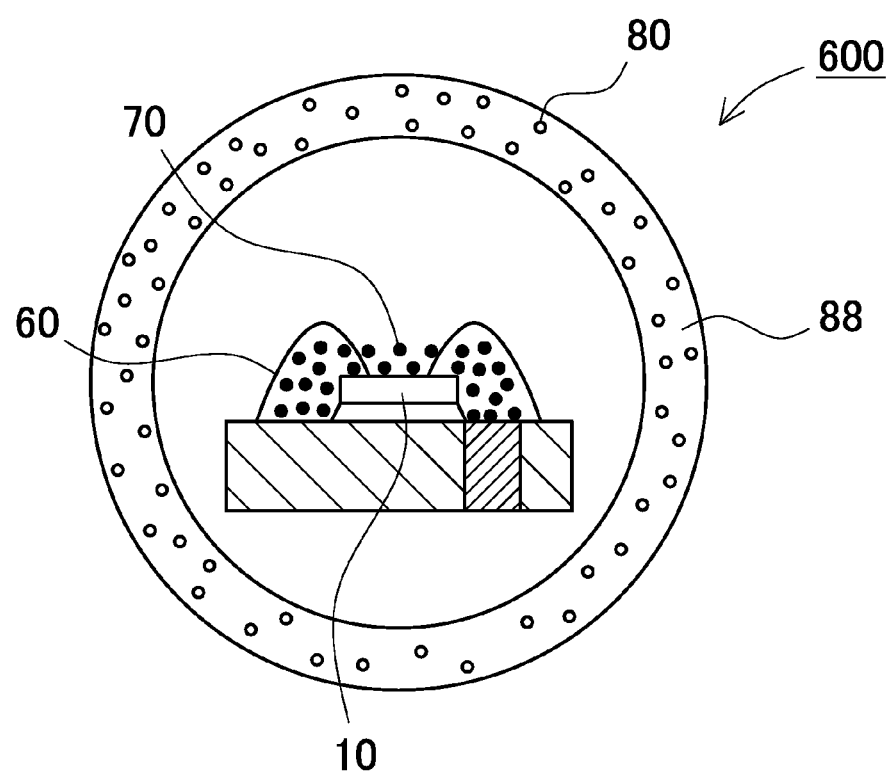
FIG. 7 is a schematic cross-sectional view showing a light emitting device according to a fifth modified embodiment of the present invention.
Figure 8:
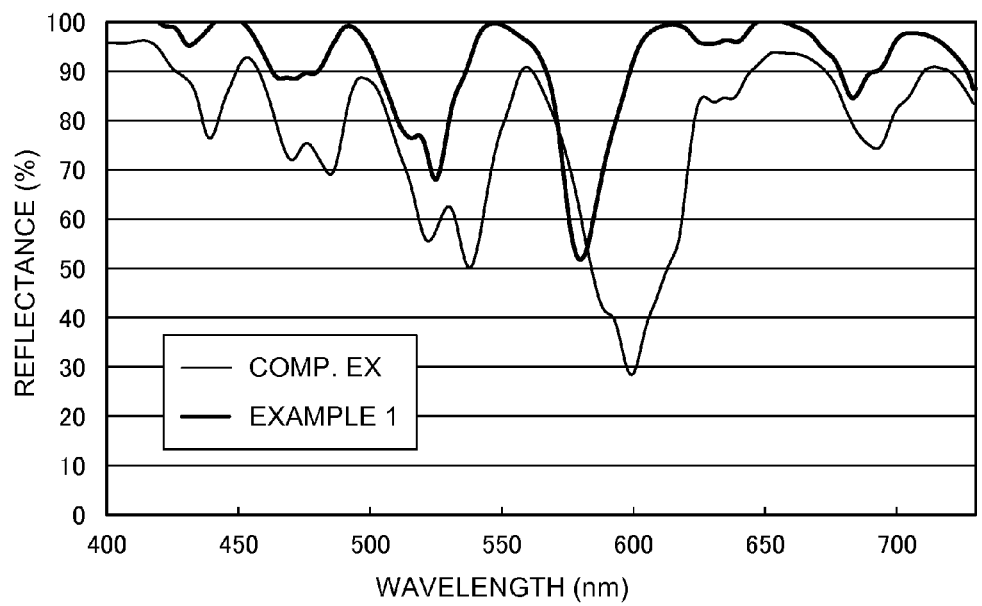
FIG. 8 is a graph showing the reflection spectra of filler materials used in an example 1 and a comparative example.
Figure 9:
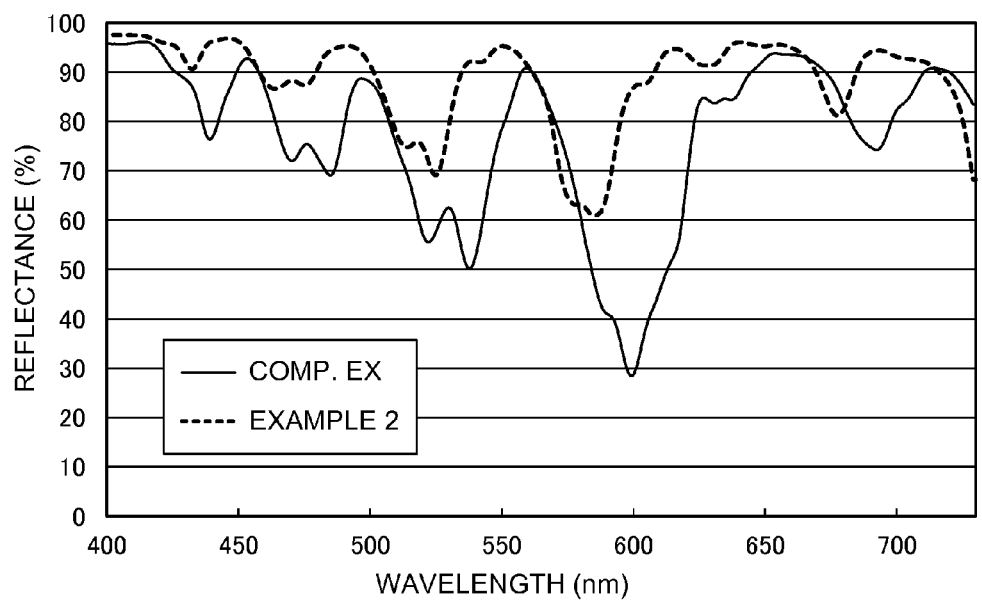
FIG. 9 is a graph showing the reflection spectra of filler materials used in an example 2 and the comparative example.
Figure 10:
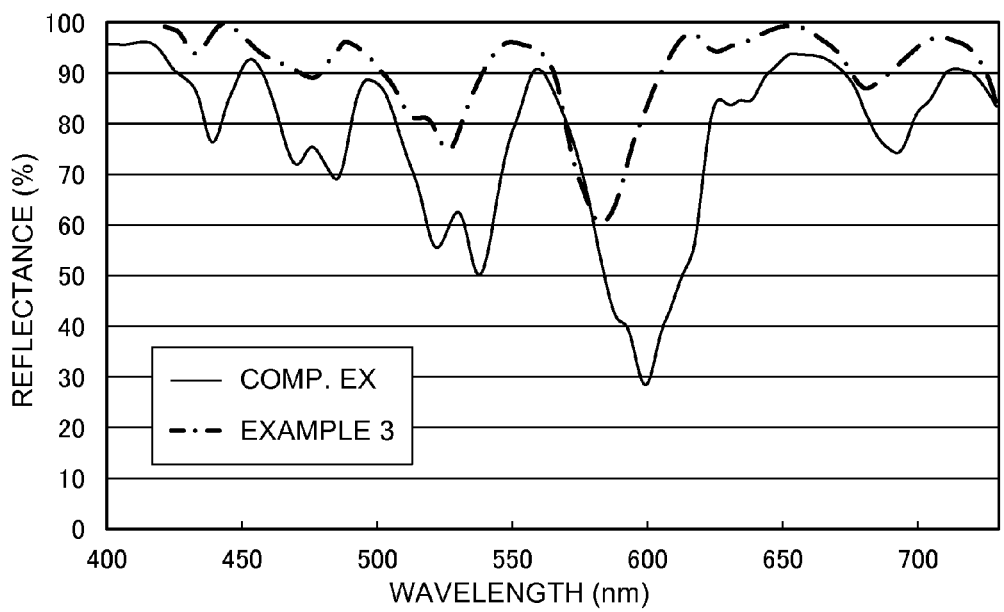
FIG. 10 is a graph showing the reflection spectra of filler materials used in an example 3 and the comparative example.
Figure 11:
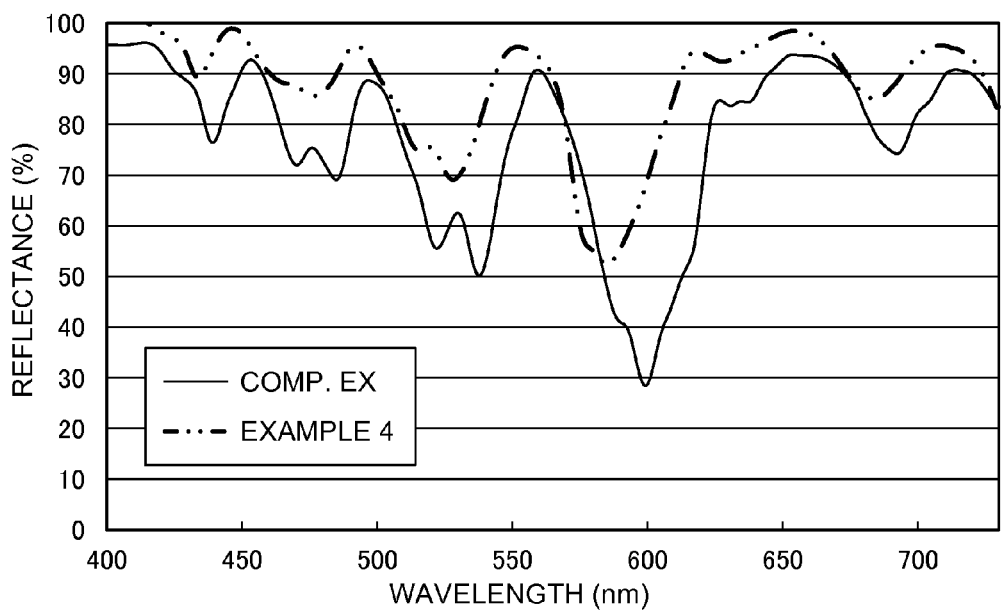
FIG. 11 is a graph showing the reflection spectra of filler materials used in an example 4 and the comparative example.
Figure 12:
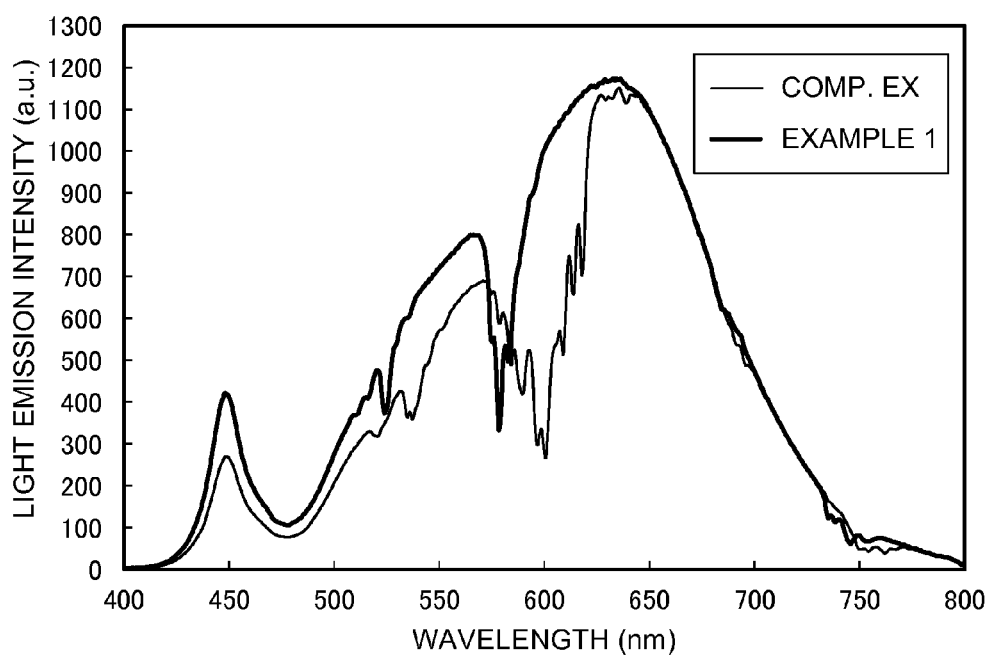
FIG. 12 is a graph showing the light emission spectra of light emitting devices according to the example 1 and the comparative example.
Figure 13:
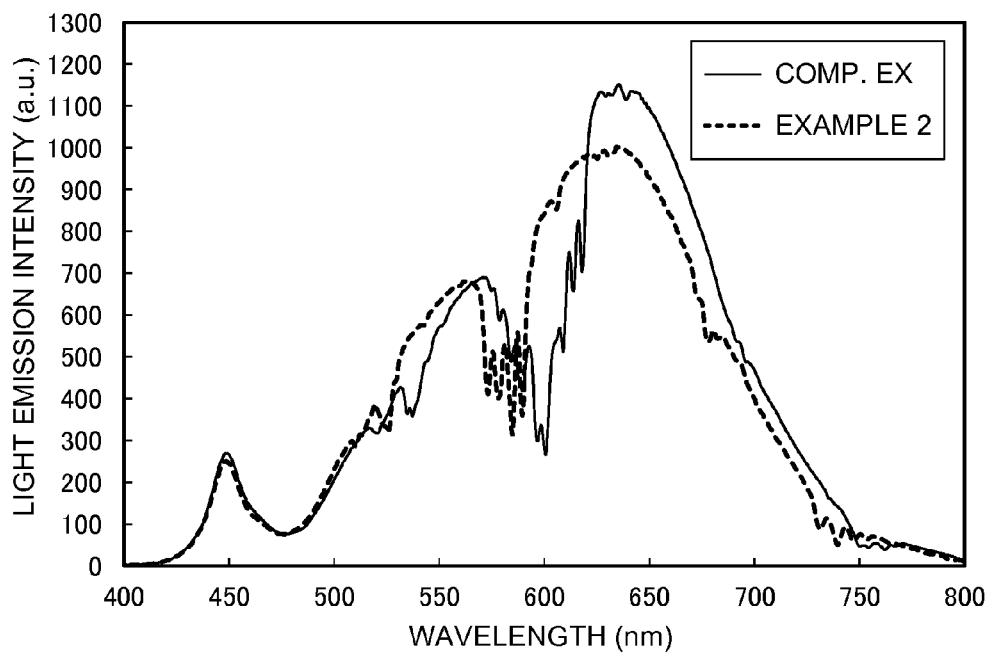
FIG. 13 is a graph showing the light emission spectra of light emitting devices according to the example 2 and the comparative example.
Figure 14:
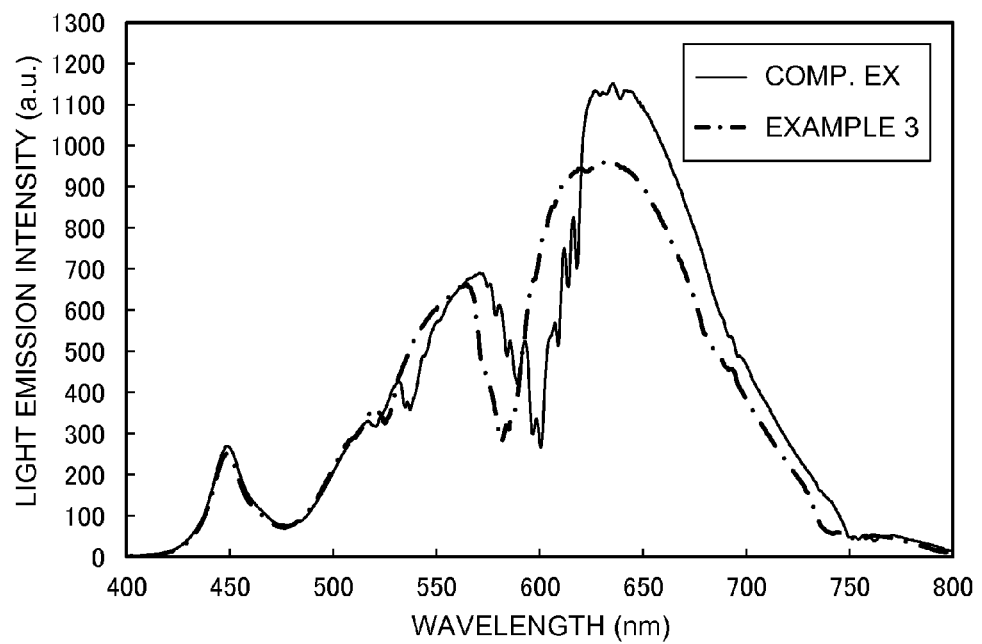
FIG. 14 is a graph showing the light emission spectra of light emitting devices according to the example 3 and the comparative example.
Figure 15:
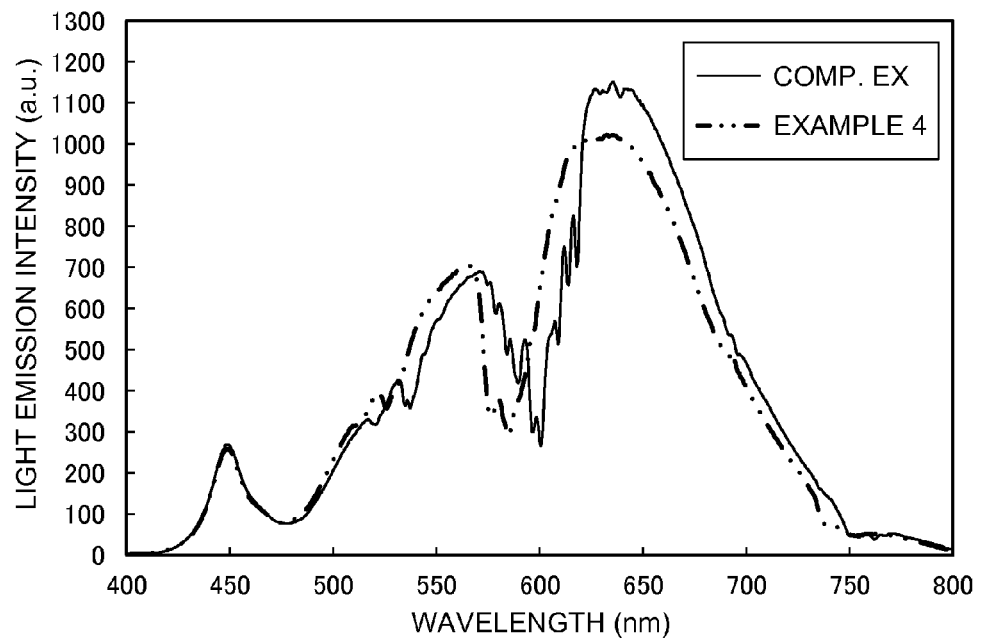
FIG. 15 is a graph showing the light emission spectra of light emitting devices according to the example 4 and the comparative example.

A light emitting device 600 according to a fifth modified embodiment shown in FIG. 7 includes a cylindrical covering member 88 which covers the periphery of the light emitting element 10 as viewed in cross-section. The filler material 80 is mixed in the covering member 88. In another modified embodiment, the filler material 80 may be applied on the surface of the covering member. In the case where the filler material is contained in an independent member separated from the sealing member that contains the phosphor, existing light emitting devices can be easily subjected to control of the filler material according to this embodiment of the present invention.

Since the light emitting devices according to the embodiments of the present invention can have a high color rendering and a high efficiency, they are of great value in industry. They can be used not only for a lighting apparatus but also for a display apparatus (e.g., display and radar), LCD backlight, and the like.

What is claimed is:

1. A light emitting device comprising:
a light emitting element;
a molded member surrounding said light emitting element; and
a sealing member that covers said light emitting element, the sealing member containing:
a phosphor that is excited by light of said light emitting element and that emits luminescent radiation, and a filler material that contains at least one selected from the group consisting of neodymium hydroxide, neodymium aluminate and neodymium silicate, wherein said phosphor contains at least one selected from the group consisting of $(Lu, Y, Gd)_3(Al, Ga)_5O_{12}:Ce$, $(Sr, Ca)AlSiN_3:Eu$, $(Ba, Sr, Ca)_2SiO_4:Eu$, $Ca_8MgSi_4O_{16}Cl_2:Eu$, and $Sr_4Al_{14}O_{25}:Eu$, and
a light emission intensity of the light emitting element decreases substantially for wavelengths between 580 to 600 nm and is at its maximum at around a wavelength of 630 nm.

2. The light emitting device according to claim 1, wherein said filler material contains neodymium hydroxide, wherein the neodymium hydroxide is $Nd(OH)_3$ or $NdO_2H$.

3. The light emitting device according to claim 1, wherein said filler material contains neodymium aluminate or neodymium silicate, wherein the neodymium aluminate or neodymium silicate is represented by a general formula $Nd_xM_yO_z$ where M is Si or Al, and x, y and z satisfy $1 \leq x \leq 10$, $1 \leq y \leq 15$, and $3 \leq z \leq 45$, respectively.

4. The light emitting device according to claim 1, wherein said filler material contains neodymium aluminate or neodymium silicate, wherein the neodymium aluminate or neodymium silicate is at least one selected from the group consisting of $NdAlO_3$, $Nd_2Si_2O_7$, and $Nd_{9.83}((Si, Al)O_4)_6 O_2$.

5. The light emitting device according to claim 1, wherein the reflectance of said filler material is not smaller than 50% and not greater than 65% in the wavelength range of not shorter than 575 nm and not longer than 605 nm.

6. The light emitting device according to claim 1, wherein the added amount of said filler material is not smaller than 0.01% by weight and not greater than 10% by weight of the material of said sealing member.

7. The light emitting device according to claim 1, wherein the mean particle diameter of said filler material is not smaller than 0.1 µm and not greater than 5 µm.

8. The light emitting device according to claim 1, wherein said sealing member includes a first portion that covers said light emitting element and contains said phosphor, and a second portion that covers said first portion and contains said filler material.

9. The light emitting device according to claim 8, wherein said first portion is spaced at an interval from said second portion.

10. The light emitting device according to claim 8, wherein said first or second portion is arranged on the upper surface of said molded member.

11. The light emitting device according to claim 1, wherein said phosphor and said filler material are mixed in said sealing member.

12. The light emitting device according to claim 1, wherein the material of the said sealing member is a light-transmissive resin.

13. The light emitting device according to claim 1, wherein said light emission intensity for wavelengths between 580 to 600 nm decreases to approximately 30% of a light emission intensity at a wavelength of 630 nm.

* * * * *